June 3, 1952 L. E. POTTER 2,599,068

ADJACENT CHANNEL REJECTION BY MAGNETO-STRICTION

Filed Oct. 31, 1950

INVENTOR
Louis E. Potter
BY H. L. Newton
ATTORNEY

Patented June 3, 1952

2,599,068

UNITED STATES PATENT OFFICE 2,599,068

ADJACENT CHANNEL REJECTION BY MAGNETO-STRICTION

Louis E. Potter, Merchantville, N. J., assignor to Radio Corporation of America, a corporation of Delaware Application October 31, 1950, Serial No. 193,080

6 Claims. (Cl. 178—44)

This invention relates to interstage coupling transformers for use in signal amplifying systems. More particularly this invention relates to fixed frequency coupling transformer utilizing electro-mechanical elements to achieve a highly selective bandpass network suitable for use in selective signal amplifying systems such as intermediate-frequency amplifiers.

Magnestostrictive effects have been observed by investigators for the past 50 years or more. One of the effects noted is the decrease in the electrical impedance of an inductor or coil over a very narrow band of frequencies when associated with a polarized vibrating element of magnetostrictive material having a predetermined frequency of its mechanical resonance.

Some of the signal amplifying systems in radio receivers are employed to amplify the signal-modulated carrier waves before final detection or demodulation to recover the modulation or intelligence signals. In such cases, it is necessary to restrict the signal amplification to a particular band of frequencies so that suitable selection may be effected of a desired one of a number of adjacent carrier wave signaling channels.

Superheterodyne receiving systems utilize a fixed frequency amplifying system referred to as an intermediate-frequency amplifier. The signal-modulated carrier waves which are impressed upon an amplifying system of this character from the output circuit of a frequency converter stage have a predetermined fixed intermediate frequency. Accordingly, such an amplifier is required to effect amplification substantially uniformly over a band of frequencies centered about the fixed intermediate-frequency. The width of the frequency band to be amplified for maximum fidelity of signal amplification should be substantially equal to the band width of the carrier wave signaling channel. At the same time, the amplifying system should be capable of substantially completely attenuating all frequencies outside of the predetermined band in order to prevent interference from signal-modulated carrier waves having frequencies in adjacent signaling channels.

Accordingly, intermediate-frequency signal amplifying systems are provided with resonant circuit facilities designed to render the system effective for the amplification of the desired signals and, at the same time, to render them ineffective for the amplification of undesired signals in channels adjacent to the selected one. While the tuned circuits of frequency selective amplifying systems of the character described, in most cases operate satisfactorily, there are numerous instances where, by reason of the fact that the radio receiver is made highly sensitive for the reception of relatively weak signals, relatively strong signals in adjacent channels are not completely rejected by the tuned circuits of the amplifying systems so that some interference and consequent signal distortion results. Usually the deficiency of frequency selective amplifying systems is caused by the fact that the resonant circuits do not have a sufficiently sharp cut off at the limiting frequencies of the frequency band to be amplified.

Systems of the prior art, which have been devised to provide a greater slope of the response characteristic at the limiting frequencies of the response characteristic, have included the utilization of a plurality of inductively coupled tuned circuits, feedback networks exhibiting high Q characteristics, and mechanically and inductively coupled absorption devices. However, many of these devices, due to their fixed nature, require highly exact manufacturing techniques with a consequent high cost. Also, in the devices of the prior art, the features of simplicity of structure and efficiency of operation were generally mutually exclusive.

Accordingly, it is an object of this invention to provide an improved, frequency-selective coupling transformer wherein frequencies adjacent the band of frequencies to be passed are substantially completely attenuated.

It is another object of this invention to provide an improved coupling transformer having energy absorbing facilities respectively resonant at frequencies immediately adjacent the band of frequencies to be passed.

It is a further object of this invention to provide a highly efficient improved interstage coupling transformer having a magnetic structure and electro-mechanical facilities so arranged as to establish a relatively high Q energy absorbing system to attentuate frequencies adjacent the band of frequencies to be passed.

In accordance with the present invention there is provided a frequency-selective signal-amplifying system embodying one or more interstage coupling transformers coupled between a source of signals and a signal amplifying device or utilization apparatus. The transformer comprises inductively coupled primary and secondary windings, each of which may be capacitively or inductively tuned for resonance in the band of frequencies to be amplified. Each of the windings is provided with a core of magnetic material having at least one face which extends beyond the periphery of the windings. A pair of electro-mechanically resonant bars, resonant at frequencies adjacent the band of frequencies to be amplified, are disposed contiguous to the extending face of one of the cores so as to absorb, and thereby prevent the transfer of energy at the frequencies of mechanical resonance.

The organization and method of operation of the invention as well as additional objects and advantages thereof, will best be understood from the following description when read in connection with the accompanying drawing in which like reference numerals have been used for like parts throughout, and in which.

Figure 1:
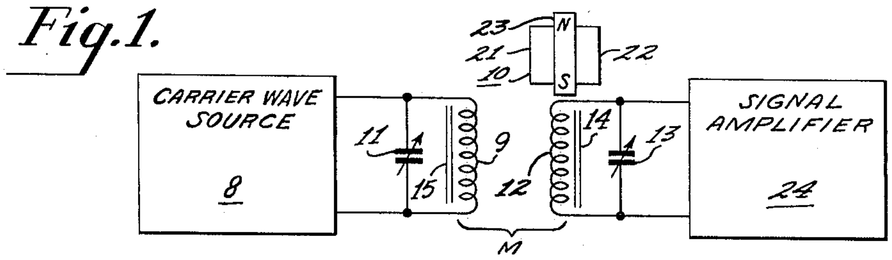
Figure 1 is a diagrammatic representation, partly in block diagram, of a frequency selective amplifying system embodying the invention.
Figure 2:
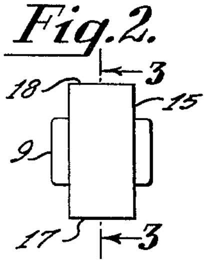
Figure 2 is a side elevation view of the device illustrated in Figure 2.
Figure 3:
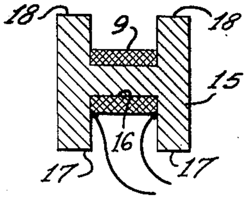
Figure 3 is a front elevation view of the primary structure of a transformer embodying the invention.

Referring now to Figure 1 of the drawing, there is shown a source 8 of signal-modulated carrier waves. For example, the signal source 8 may be a frequency converter stage of a superheterodyne radio receiver. The output circuit of the signal source 8 is coupled to the primary winding 9 of an interstage coupling transformer 10, which, in the case of a superheterodyne radio receiver, may be the first stage intermediate-frequency transformer. The winding 9 is tuned to resonance by an adjustable shunt-connected capacitor 11 for response over a predetermined band of frequencies, the center frequency of which corresponds to the predetermined intermediate frequency.

There is inductively coupled to the primary winding 9 a secondary winding 12 which may also be tuned to resonance at the intermediate frequency by an adjustable shunt connected capacitor 13.

The primary and secondary windings respectively have associated therewith individual cores 14 and 15. The shape of the cores 14 and 15 are illustrated in Figures 2 through 5. It is noted at this time that the depth of the slot 16 in the opposing faces 17, 18, 19 and 20 of the cores 14 and 15 is respectively greater than the thickness of the engaged windings 9 and 12 so that a portion of each core extends beyond the periphery of its winding. These cores, or bobbins 14 and 15, are made of ferrite or powdered iron to provide a magnetic structure of low reluctance. It is, of course, to be understood that the particular form of the core 14 or 15 is illustrated purely by way of example and that the limiting requirement is that a portion of the core must extend beyond the periphery of its coil or winding so that the magnetic circuit is efficiently closed through the bars by virtue of physical contact between the bars and the core across a slot for receiving the coil.

There is associated with the secondary structure, winding 12 and core 14, a pair of magnetostrictive, electro-mechanical resonant bars 21 and 22 and a permanent magnet 23 to provide magnetic bias for the bars 21 and 22. These bars, 21 and 22, are good electro-mechanical resonators preferably being made of magnetostrictive material, such as certain magnetic ferrites. The dimensions of the bars 21 and 22 are such that bar 21 has a sharp mechanical resonance point at a frequency which is lower than the band of intermediate frequencies, and the bar 22 has a sharp mechanical resonance point at a frequency which is higher than the band of intermediate frequencies. It is, of course, to be understood that the mechanical resonance points of the respective bars can be opposite to that indicated as the specific assignment of resonant frequencies is selected for the purpose of illustration only. Also, it is to be understood that the magnetic bias provided by permanent magnet 23 can be provided by electro-magnetic means.

The secondary winding 12 is coupled to the input circuit of a signal amplifying stage 24, which may be an intermediate frequency amplifier stage, a combined detector and modulation signal amplifier stage or other utilization device.

Figure 4:
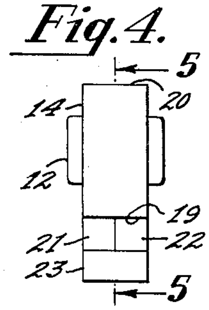
Figure 4 is a side view of the secondary structure of a transformer embodying the invention.
Figure 5:
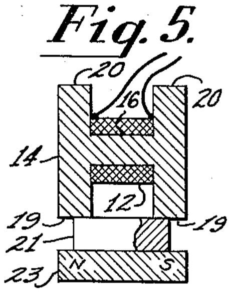
Figure 5 is a front elevation view in cross-section, of the device illustrated in Figure 4 taken along line 5—5; and, Figure 6 is a graph showing curves illustrative of the frequency response characteristic of the transformer structure of the invention with and without the magneto-strictive elements.

It can be seen by reference to Figures 4 and 5 that the electro-mechanical bars 21 and 22 are disposed in contact with the face 19 of the core 14 thereby providing a low reluctance magnetic link for the intermediate-frequency magnetic fields established by current in the secondary winding 12. The intimate coupling provided by the structure of the invention is necessary to full utilization of the absorption phenomenon at electro-mechanical resonance of the magnetostrictive bars 21 and 22. The permanent magnet 23 is disposed in contact with the side of the bars opposite to core 14 to provide magnetic bias for suitably polarizing the two bars for good magnetostrictive activity. It is, of course, within the purview of this invention that the absorption structure as herein described can be associated with the primary structure of the transformer as it is evident from an inspection of Figures 2 through 5 that the windings and cores of the primary and secondary structures are equivalent; however, the embodiment herein discussed and illustrated is preferred.

Figure 6:
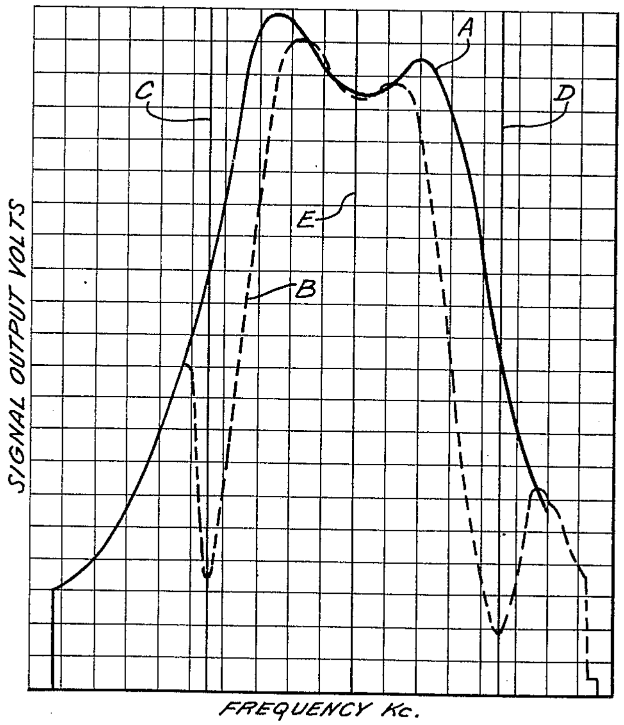

Referring now to the operation of the apparatus embodying the present invention, additional reference will be made to Figure 6 of the drawing. Curve A illustrates the frequency versus signal output characteristic of a coupling transformer constructed in accordance with Figure 2 through 5 but without the energy absorption facilities. It is seen that, in the regions bordering the desired band width of frequency response, which is represented by the frequency spectrum between the vertical lines C and D on the graph of Figure 6, there is a considerable response by the transformer to frequencies immediately adjacent to the limiting frequencies, vertical lines C and D of the graph of Figure 6, of the band which it is desired to amplify. However, by the use of the magnetostrictive bars 21 and 22 in accordance with the invention, the slope and width of the two skirts of the curve may be materially modified as indicated by the dotted line curve B. At resonance the bars will draw energy from the secondary circuit and in effect make it appear like a very high Q trap circuit.

The sharp attenuation of the frequencies outside of the desired pass band which is indicated by the section of the curve lying adjacent the vertical line C is effected by the action of the magnetostrictive bar 21 which is resonant at this particular frequency, and accordingly, absorbs substantial energy from the signals impressed upon the secondary winding 12 to produce the sharp dip indicated in the curve.

Similarly, the section of the curve lying adjacent the vertical line D is effected by the action of the magnetostrictive bar 22 which is resonant at this particular frequency, and accordingly, absorbs substantial energy at frequencies above the desired pass band.

It, therefore, may be seen that the use of magnetostrictive bars 21 and 22 in the coupling transformer 10 produces a materially sharper cutoff of the tuned circuits of the transformer.

It should be apparent that the improved frequency selective signal amplifying system in accordance with the present invention provides for a relatively high order of adjacent channel frequency rejection with a minimum modification of conventional interstage coupling transformers. It should be apparent that the improved coupling between the magnetostrictive element and the transformer cores, as provided in accordance with this invention, could also be utilized to energize the driven element in a magnetostrictive filter system. The coupling as herein provided would give improved input coupling to and improved output coupling from magnetostrictive filter systems thereby enabling more efficient use of such systems.

In order to more clearly describe the operation of the signal amplifying system embodying the invention without, however, intending to restrict its field of use, assume that it is to be used in the intermediate-frequency amplifying stages of a superheterodyne receiver for the reception of radio-frequency carrier waves in the broadcast band of frequencies. In such a case, the center intermediate-frequency may be 455 kilocycles, which is indicated by the vertical heavy line E of Figure 6. In the amplitude-modulation broadcast band adjacent channels are spaced apart by 10 kilocycles. Accordingly, in the transformer 10 the magnetostrictive bar 21 should be ground so that it is resonant at a frequency of 445 kilocycles corresponding to the heavy line C on the graph of Figure 6, and magnetostrictive bar 22 should be ground so that it is resonant at a frequency of 465 kilocycles corresponding to the heavy line D on the graph of Figure 6.

Obviously, other frequencies may be chosen by those skilled in the art for accomplishing different results without departing from the scope of the present invention. In one particular case, however, when operating according to the specific frequencies referred to, the transformer cores were made of magnetic ferrite material approximately 0.50 inch square in cross section and approximately 0.25 inch in thickness. The magnetostrictive bars were made of magnetostrictive material approximately 0.125 inch square in cross section and approximately 0.215 inch in length. The individual bars were ground specifically different in order to effect resonance thereof at the desired frequencies. The adjustment in length of the bars, however, is one which, it will be understood by those skilled in the art, is comparable to the adjustment of a trimmer capacitor for achieving the exact resonance desired.

It was found that, when using bars of the character described and when operating at the particular frequencies referred to, in one transformer an increased attenuation of adjacent channel signals was in the order of 3.6 to 1 on the high side and 5.56 to 1 on the low side with an average increased adjacent channel attenuation of 4.58 to 1.

There has therefore been provided a novel and useful coupling transformer having a core and absorption facilities so as to effect a greatly improved adjacent channel attenuation where it is desirable to select a desired band of frequencies to the substantial exclusion of frequencies lying without the desired band.

What is claimed is:

1. A coupling transformer for a source of signal-modulated carrier waves having a predetermined frequency band, and comprising inductively coupled primary and secondary windings tuned for resonance in said predetermined frequency band, a core for each of said windings, said core including at least one surface having a slot therein to receive said winding and being of a depth greater than the thickness of said winding, said winding being disposed within said said slot, magnetostrictive resonating bars contiguous to said surface and perpendicular to said slot thereby being magnetically coupled with said secondary winding, said bars being resonant respectively at different desired frequencies outside of said predetermined band of frequencies, and magnetic means assoicated with said bars for providing a predetermined polarizing magnetic bias.

2. A band pass coupling transformer adapted to couple the output circuit of a source of signal modulated carrier waves having a predetermined frequency band to the input circuit of a signal utilization means, and comprising primary and secondary structures each including a core of magnetic material, a coil on said core, said coil being adapted to be tuned for resonance in said predetermined frequency band, said core being formed with a slot in one face thereof to receive said coil and being of a depth greater than the thickness of said coil, said structures being in juxtaposition and inductively coupled, a pair of magnetostrictive resonating bars contiguous to said slotted face of said secondary structure and perpendicular to said slot, each of said bars being respectively resonant at a different frequency outside of said predetermined band of frequencies; and magnetic means contiguous with said bars opposite said core for providing a predetermined polarizing bias.

3. A band pass coupling transformer for a source of signal-modulated carrier waves having a predetermined frequency band and comprising a primary and a secondary structure each including a core, said cores being formed of magnetic material and having two parallel and oppositely disposed faces, each of said faces having a slot therein, a coil on each of said cores, said coil engaging said oppositely disposed slots and and the periphery of said coils being within the confines of said slots, said coils being adapted to be tuned for resonance in said predetermined frequency band, said structures being in juxtaposition and inductively coupled, a pair of electro-mechanical resonating bars positioned contiguous with one of said faces of one of said structures, said bars being respectively resonant at different frequencies adjacent said predetermined band of frequencies, and a magnetic means contiguous with said electro-mechanical bars for providing a predetermined magnetic bias.

4. A band pass coupling transformer for a source of signal-modulated carrier waves having a predetermined frequency band and comprising a primary and a secondary structure each including a core, said core being formed of magnetic material and having two parallel and oppositely disposed faces, each of said faces having a slot therein, a coil on each of said cores, said coil engaging said oppositely disposed slots and the periphery of said coils being within the confines of said slots, said coils being adapted to be tuned for resonance in said predetermined frequency band, said structures being in juxtaposition and inductively coupled, a pair of electromechanical resonating bars positioned contiguous with one of said faces of said primary structure, said bars being respectively resonant at different frequencies adjacent said predetermined band of frequencies, and a permanent magnet contiguous with both of said electromechanical bars for providing a predetermined magnetic bias.

5. A band pass coupling transformer for a source of signal modulated carrier waves having a predetermined frequency band and comprising a primary and a secondary structure each including a core, said core being formed of finely divided magnetic material and having two parallel and oppositely disposed faces, each of said faces having a slot therein, a coil on each of said cores, said coil engaging said oppositely disposed slots and the periphery of said coils being within the confines of said slots, said coils being adapted to be tuned for resonance in said predetermined frequency band, said structures being in juxtaposition and inductively coupled, a pair of electro-mechanical resonating bars positioned contiguous with one of said faces of said secondary structure, said bars being respectively resonant at different frequencies adjacent said predetermined band of frequencies, and a permanent magnet contiguous with both of said electro-mechanical bars for providing a predetermined magnetic bias.

6. A band pass coupling transformer for a source of signal modulated carrier waves having a predetermined frequency band and comprising a primary and a secondary structure each including a core of finely divided magnetic material, a coil on each of said cores, a capacitor connected in shunt with each of said coils for tuning said coils for resonance in said predetermined frequency band, said core including at least one surface having a slot therein to receive said coil, said slot being of greater depth than the thickness of said coil, said structures being in juxtaposition and inductively coupled, a pair of magnetostrictive resonating bars contiguous to said slotted surface of said secondary structure and perpendicular to said slot, one of said bars being respectively resonant at adjacent frequencies below and above the limiting frequencies of said predetermined band of frequencies, and a permanent magnet contiguous to said bars opposite said core for providing a predetermined polarizing magnetic bias.

LOUIS E. POTTER.

REFERENCES CITED

The following references are of record in the file of this patent:

UNITED STATES PATENTS

| Number | Name | Date |
|---|---|---|
| 1,438,500 | McDonald | Dec. 12, 1922 |
| 2,091,250 | Blackman | Aug. 31, 1937 |
| 2,094,044 | Mason | Sept. 28, 1937 |
| 2,454,713 | O'Meara | Nov. 23, 1948 |
| 2,547,027 | Winkler | Apr. 3, 1951 |